(12) United States Patent
Huang

(10) Patent No.: US 11,705,902 B2
(45) Date of Patent: Jul. 18, 2023

(54) SUPPLY VOLTAGE DETECTING CIRCUIT AND CIRCUIT SYSTEM USING THE SAME

(71) Applicant: NUVOTON TECHNOLOGY CORPORATION, Hsinchu (TW)

(72) Inventor: Ming-Hsin Huang, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/400,542

(22) Filed: Aug. 12, 2021

(65) Prior Publication Data

US 2022/0263503 A1 Aug. 18, 2022

(30) Foreign Application Priority Data

Feb. 17, 2021 (TW) .................................. 110105385

(51) Int. Cl.
*H03K 17/22* (2006.01)
*H03K 17/687* (2006.01)
*H03K 17/14* (2006.01)

(52) U.S. Cl.
CPC ......... *H03K 17/223* (2013.01); *H03K 17/145* (2013.01); *H03K 17/6872* (2013.01)

(58) Field of Classification Search
CPC ... H03K 17/145; H03K 17/223; H03K 17/687
See application file for complete search history.

(56) References Cited

U.S. PATENT DOCUMENTS

| | | | | |
|---|---|---|---|---|
| 6,160,391 A * | 12/2000 | Banba | ..................... | G05F 3/242 363/73 |
| 7,768,339 B2 * | 8/2010 | Suzuki | ..................... | G05F 1/569 323/275 |
| 8,026,756 B2 * | 9/2011 | Yuasa | ....................... | G05F 3/30 327/539 |
| 8,294,450 B2 * | 10/2012 | Lee | ........................... | G05F 3/30 327/539 |
| 8,786,358 B2 * | 7/2014 | Endo | ....................... | G05F 3/245 327/539 |
| 9,030,186 B2 * | 5/2015 | Gupta | ....................... | G05F 3/30 323/901 |
| 11,378,993 B2 * | 7/2022 | Dyer | ..................... | G05F 1/5735 |

* cited by examiner

*Primary Examiner* — Ryan Johnson
*Assistant Examiner* — Colleen J O Toole
(74) *Attorney, Agent, or Firm* — Muncy, Geissler, Olds & Lowe, P.C.

(57) ABSTRACT

A supply voltage detecting circuit has a voltage detection circuit and a current clamping circuit. The voltage detection circuit receives and detects a supply voltage and is used to detect to generate a low-voltage detection signal. When the supply voltage is lower than a set level, the low voltage detection signal output by the voltage detection circuit turns off the current clamping circuit, and a transistor current flowing through the voltage detection circuit is proportional to the supply voltage; and when the supply voltage is higher than or equal to the set level, the low voltage detection signal output by the voltage detection circuit turns on the current clamping circuit, and the current clamping circuit provides a constant current to maintain the operation of the voltage detection circuit, wherein the transistor current flowing through the voltage detection circuit is proportional to the constant current.

12 Claims, 11 Drawing Sheets

SUPPLY VOLTAGE DETECTING CIRCUIT AND CIRCUIT SYSTEM USING THE SAME

BACKGROUND

Technical Field

The present disclosure relates to a supply voltage detecting circuit, in particular to a supply voltage detector with a stable temperature coefficient, low power consumption and fast response, and to a circuit system using the same.

Related Art

The supply voltage detecting circuit is also called a brown out detector (BOD) or a low voltage detector (LVD). After the circuit system is turned on, the microcontroller will activate the power voltage detection mechanism to determine the working mode according to the low voltage, and the detection result can be even served as a basis for switching between different power sources. The accuracy of voltage detection and temperature characteristics are very important, and the power consumption and response speed of voltage detection are also items that will be discussed in the specifications. Since the supply voltage detecting circuit needs to detect the supply voltage (for example, VDD), one of the most common manners is to use a resistor string to divide the supply voltage to generate the sensing voltage, and compare the sensing voltage with the reference voltage generated by the bandgap voltage generator to determine whether to make the circuit system operate in the low voltage working mode or start to enter the normal working mode. Generally speaking, the response speed and the power consumption of the supply voltage detecting circuit relative to the circuit area are usually in a trade-off relationship.

Refer to FIG. 1, and FIG. 1 is a circuit diagram of a conventional supply voltage detecting circuit. In the supply voltage detecting circuit 1, a MOS transistor MN1, a PMOS transistor MP1 and a resistor $R_3$ form a latch circuit, and resistors $R_2$ and $R_3$ serve as a voltage dividing resistor string. The low-voltage detection signal BODOUT output by supply voltage detecting circuit 1 will be related to the threshold voltage (VTH) of the MOS transistor MN1 and the PMOS transistor MP1. In the integrated circuit manufacturing process, the threshold voltage variation is as high as ±20%, even when the threshold voltage is in a slow-fast (SF) or fast-slow (FS) corner, it will reach a variation of 40%. Thus, it causes the supply voltage detecting circuit 1 to output the wrong low-voltage detection signal BODOUT. For example, the expected startup voltage is 1.7 volts (that is, when the supply voltage VDD is higher than or equal to 1.7 volts, the output low-voltage detection signal BODOUT is a logic low level, so that the circuit system starts and operates in normal mode), but in fact the starting voltage falls between 1.36 to 2.04 volts.

Refer to FIG. 2, and FIG. 2 is a circuit diagram of a conventional supply voltage detecting circuit. The supply voltage detecting circuit 2 comprises a bandgap voltage generator 21 (formed by a comparator CMP2, PMOS transistors MP1 through MP3, resistors $R_3$ through $R_6$ and BJT transistors $Q_1$ through Q3), a voltage dividing resistor string (formed by resistors $R_1$ and $R_2$, both of them are connected in series) and a comparator CMP1. When the supply voltage detecting circuit 2 initiated, the bandgap voltage generator 21 is operated, and then the comparator CMP1 compares the sensing voltage VSEN generated by the resistor divider resistor string with the reference voltage VBG generated by the bandgap voltage generator 21, so as to complete the supply voltage detection. The manner of the supply voltage detecting circuit 2 can get a higher accuracy starting voltage, but this manner sacrifices power consumption.

Refer to FIG. 3A, and FIG. 3A is a circuit diagram of another one conventional supply voltage detecting circuit. The supply voltage detecting circuit 3 comprises BJT transistors $Q_1$, $Q_2$, resistors $R_1$ through $R_4$, a comparator CMP1, a PMOS transistor MP1, an AND logic gate AND1 and an inverter module301 (formed by connecting inverter in series). The BJT transistor $Q_2$ and the resistor $R_4$ form a quasi-bandgap voltage generator circuit. The PMOS transistor MP1 is controlled by an enable signal EN output by the AND logic gate AND1 to be turned on or off, so as to make the quasi-bandgap voltage generator circuit generate a reference voltage VBE2, and make the BJT transistor $Q_1$ and the resistors $R_1$ through $R_3$ to generate a sensing voltage VBER, wherein the sensing voltage VBE2 equals to a base-emitter voltage of the BJTT transistor $Q_2$. The comparator CMP1 is enabled according to the enable signal EN, and is used to compare the sensing voltage VBER with the reference voltage VBE2 to output a low-voltage detection signal. The inverter module 301 is used to generate an inverted low-voltage detection signal BODOUT_B. The AND logic gate AND1 receives the inverted low-voltage detection signal BODOUT_B and the external signal STB, so as to reset or activate the supply voltage detecting circuit 3 through the generated enable signal EN.

Refer to FIG. 3A and FIG. 3B at the same time, and FIG. 3B is waveform diagram showing signals of the supply voltage detecting circuit in FIG. 3A. When the supply voltage VDD increases, the sensing voltage VBER also increases. When the supply voltage VDD is higher than the set level $BOD_L$ and the external signal STB is equal to the logic high level ("1"), the sensing voltage VBER is higher than the reference voltage VBE2, and the inverted low-voltage detection signal BODOUT_B is the logic high level. The supply voltage detecting circuit 3 can have higher accuracy when the supply voltage VDD is a low input voltage, but the detection potential is more difficult to adjust, and the supply voltage detecting circuit 3 requires external signal STB to start and reset. After the circuit system is activated (inverted low-voltage detection signal BODOUT_B is a logic high level), the supply voltage detecting circuit 3 will form a death lock and cannot continue to be used, so it must be restarted by using the external signal STB.

SUMMARY

In order to achieve the above objective, an embodiment of the present disclosure provides a supply voltage detecting circuit, comprising: a voltage detection circuit, for receiving a supply voltage and detecting the supply voltage to generate a low-voltage detection signal; and a current clamping circuit, electrically connected to the voltage detection circuit; wherein when the supply voltage is lower than a set level, the low-voltage detection signal output by the voltage detection circuit turns off the current clamping circuit, and a transistor current flowing through the voltage detection circuit is proportional to the supply voltage; when the supply voltage is higher than or equal to the set level, the low-voltage detection signal output by the voltage detection circuit turns on the current clamping circuit, and the current clamping circuit provides a constant current to maintain operation of the voltage detection circuit, and the transistor current flowing through the voltage detection circuit is proportional to the constant current.

Optionally, the voltage detection circuit comprises a switch PMOS transistor, a first resistor, a second resistor, a third resistor, a comparator, a first diode circuit and a second diode circuit, wherein a source of the switch PMOS transistor receives the supply voltage, a gate of the switch PMOS transistor is electrically connected to an output terminal of the comparator, a drain of the switch PMOS transistor is electrically connected to a first terminal of the second resistor and a first terminal of the third resistors, a second terminal of the second resistor and a second terminal of the third resistors are respectively electrically connected to a negative input terminal and a positive input terminal of the comparator, an output terminal of the comparator outputs the low-voltage detection signal and is electrically connected to the current clamping circuit to control an on/off state of the current clamping circuit, the first diode circuit is electrically connected to the second terminal of the second resistor, a first terminal of the first resistor is electrically connected to the second terminal of the third resistor, a second terminal of the first resistor is electrically connected to the second diode circuit, and the drain of the switch PMOS transistor is further electrically connected to one terminal of the current clamping circuit, so as to receive the transistor current proportional to the constant current when the current clamping circuit is turned on.

Optionally, the current clamping circuit comprises a first PMOS transistor, a second PMOS transistor, a first NMOS transistor and a current source, a source of the first transistor and a source of the second PMOS transistors receive the supply voltage, a gate of the first PMOS transistor is electrically connected to a gate and a drain of the second PMOS transistor, and a drain of the first PMOS transistor is electrically connected to the voltage detection circuit, so as to provide the transistor current proportional to the constant current when the current clamping circuit is turned on, wherein a gate of the first NMOS transistor is electrically connected to the voltage detection circuit to receive the low-voltage detection signal, a drain of the first NMOS transistor is electrically connected to the drain of the first PMOS transistor and the drain of the second PMOS transistor, and a source of the first NMOS transistor is electrically connected to the current source to receive the constant current provided by the current source.

Optionally, each of the first diode circuit and the second diode circuit comprises at least one BJT transistor.

Optionally, the voltage detection circuit further comprises a fourth resistor and a trimming resistor, a first terminal of the trimming resistor is electrically connected to the drain of the switch PMOS transistor, a second terminal of the trimming resistor is electrically connected to the fourth resistor, and the second terminal of the fourth resistor is electrically connected to the first terminal of the second resistor and the first terminal of the third resistor.

Optionally, the fourth resistor and the trimming resistor are variable resistors, and a resistance value of the fourth resistor and a resistance value of the trimming resistor are respectively changed in response to two control signals.

In order to achieve the above objective, an embodiment of the present disclosure provides a supply voltage detecting circuit, comprising: a voltage detection circuit; and an adjustable voltage generator, electrically connected to the voltage detection circuit, receiving a supply voltage, and generating a bias voltage for biasing the voltage detection circuit; wherein the voltage detection circuit receives the bias voltage, and when the supply voltage is lower than a set level, a low-voltage detection signal output by the voltage detection circuit is at a logic low level; and when the supply voltage is higher than or equal to the set level, the low-voltage detection signal output by the voltage detection circuit is at a logic high level.

Optionally, the voltage detection circuit comprises a first resistor, a second resistor, a third resistor, a fourth resistor, a first comparator, a first diode circuit and a second diode circuit, a first terminal of the fourth resistor is electrically connected to the adjustable voltage generator to receive the bias voltage, a second terminal of the fourth resistor is electrically connected to a first terminal of the second resistor and a first terminal of the third resistor, a second terminal of the second resistor and a second terminal of the third resistor are respectively electrically connected to an negative input terminal and a positive input terminal of the comparator, an output terminal of the comparator outputs the low-voltage detection signal, the first diode circuit is electrically connected to the second terminal of the second resistor, a first terminal of the first resistor is electrically connected to the second terminal of the third resistor, and a second terminal of the first resistor is electrically connected to the second diode circuit, wherein the fourth resistor is a variable resistor having a resistance value changeable in response to a first control signal.

Optionally, the adjustable voltage generator comprises a trimming resistor, a fifth resistor, and a voltage follower, a first terminal of the trimming resistor receives the supply voltage, and a second terminal of the trimming resistor is electrically connected to a first terminal of the fifth resistor and the positive input terminal of the second comparator, and the output terminal of the second comparator is electrically connected to the negative input terminal of the second comparator, and is used to output the bias voltage, wherein the trimming resistor is variable resistor having a resistance value changeable in response to a second control signal.

In order to achieve the above objective, an embodiment of the present disclosure provides a circuit system, comprising: a load; and one of the mentioned supply voltage detecting circuits, electrically connected to the load.

In summary, compared with the prior art, the embodiments of the present disclosure provide a supply voltage detecting circuit and a circuit system using the same, which have high accuracy, low temperature drift and low power consumption.

In order to further understand the technology, means and effects of the present disclosure, reference may be made to the following detailed descriptions and the accompanying drawings, so that the purpose, features and concepts of the present disclosure can be thoroughly and concretely understood. However, the following detailed descriptions and drawings are only used to reference and illustrate the implementation of the present disclosure, and they are not used to limit the present disclosure.

BRIEF DESCRIPTION OF THE DRAWING

The accompanying drawings are provided to enable persons with ordinary knowledge in the technical field of the present disclosure to further understand the present disclosure, and are incorporated into and constitute a part of the specification of the present disclosure. The drawings illustrate exemplary embodiments of the present disclosure, and are used to explain the principle of the present disclosure together with the descriptions of the present disclosure.

DETAILED DESCRIPTION

Figure 1:
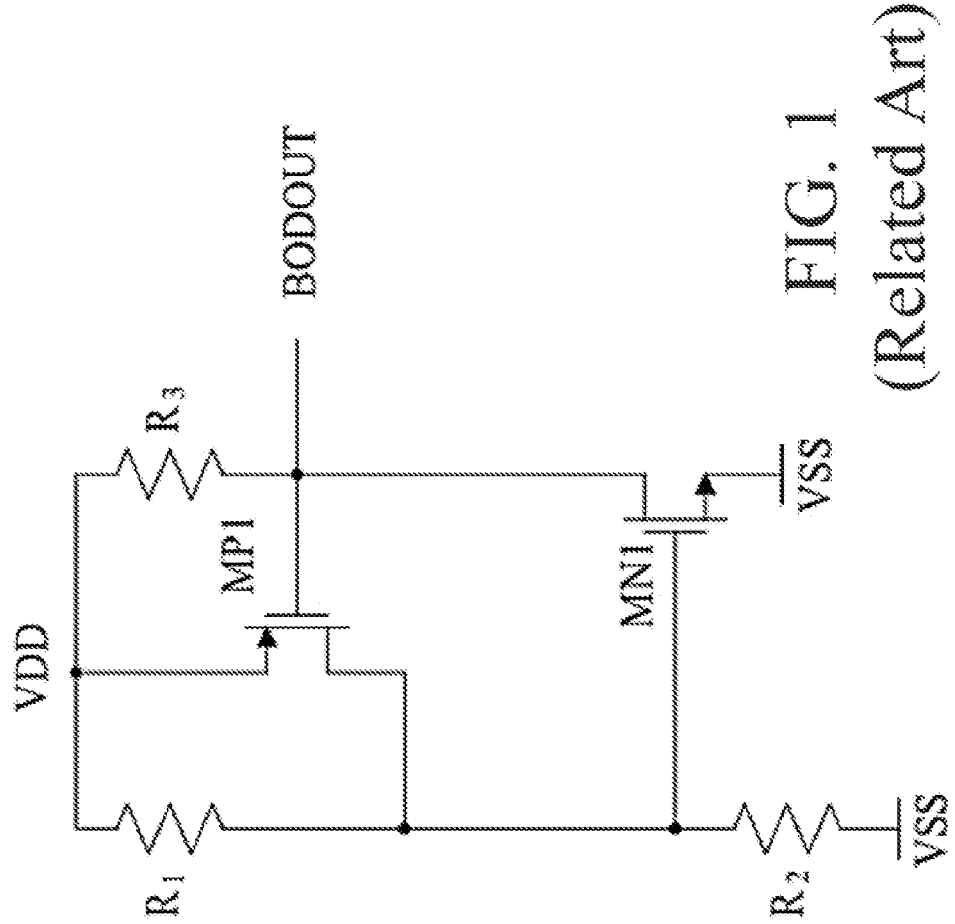
FIG. 1 is a circuit diagram of a conventional supply voltage detecting circuit.
Figure 2:
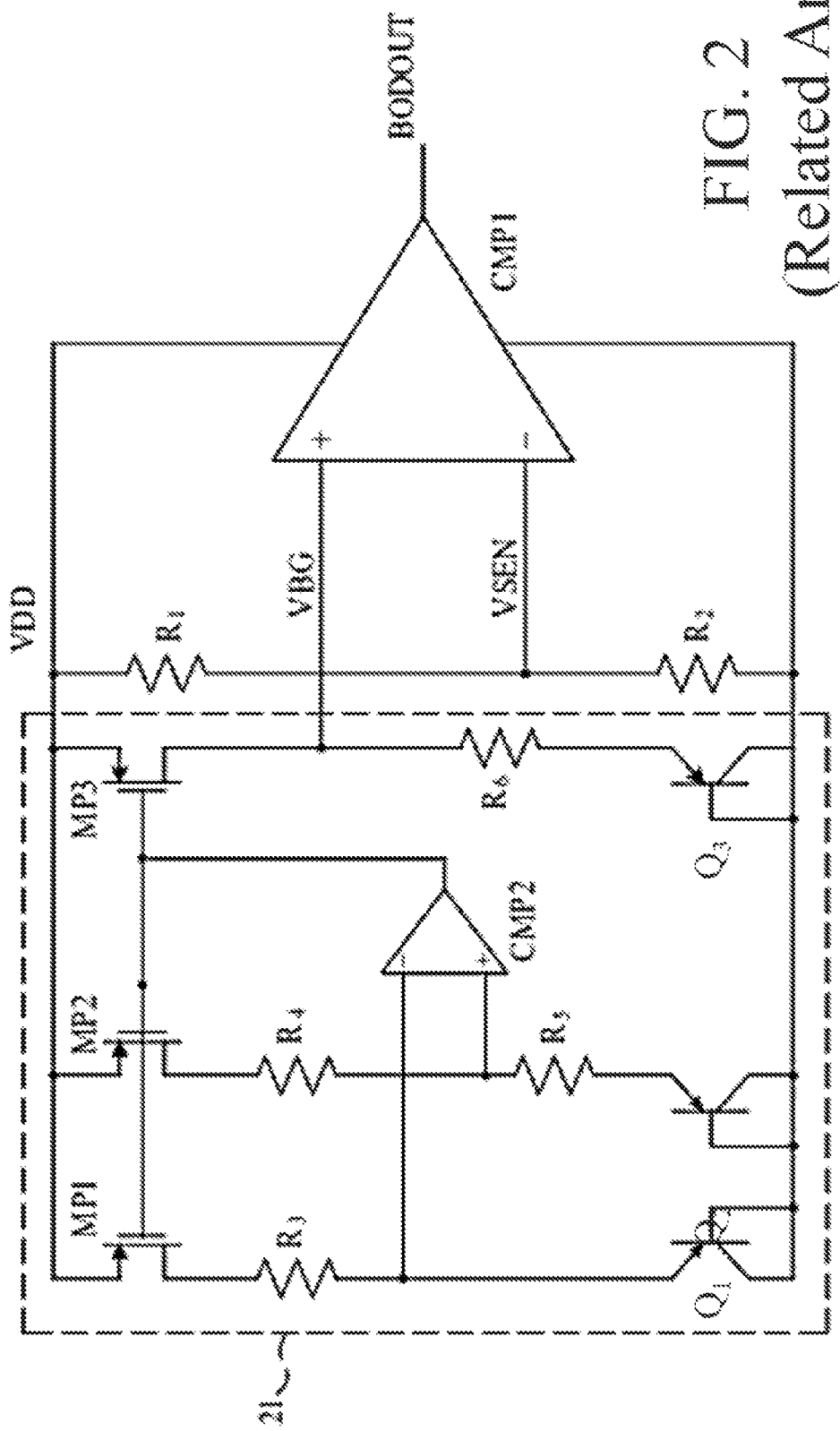
FIG. 2 is a circuit diagram of another one conventional supply voltage detecting circuit.
Figure 3A:
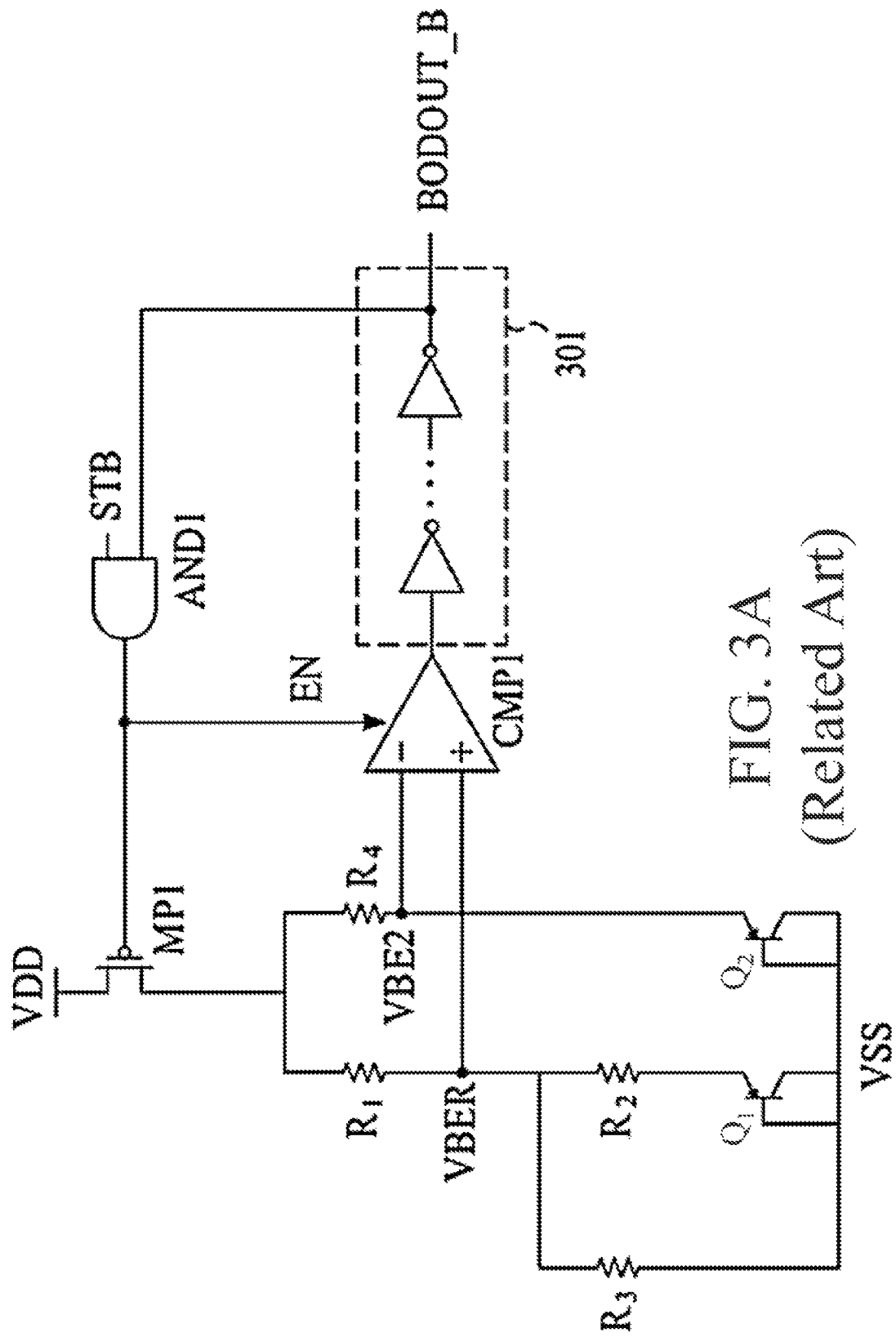
FIG. 3A is a circuit diagram of another one conventional supply voltage detecting circuit.
Figure 3B:
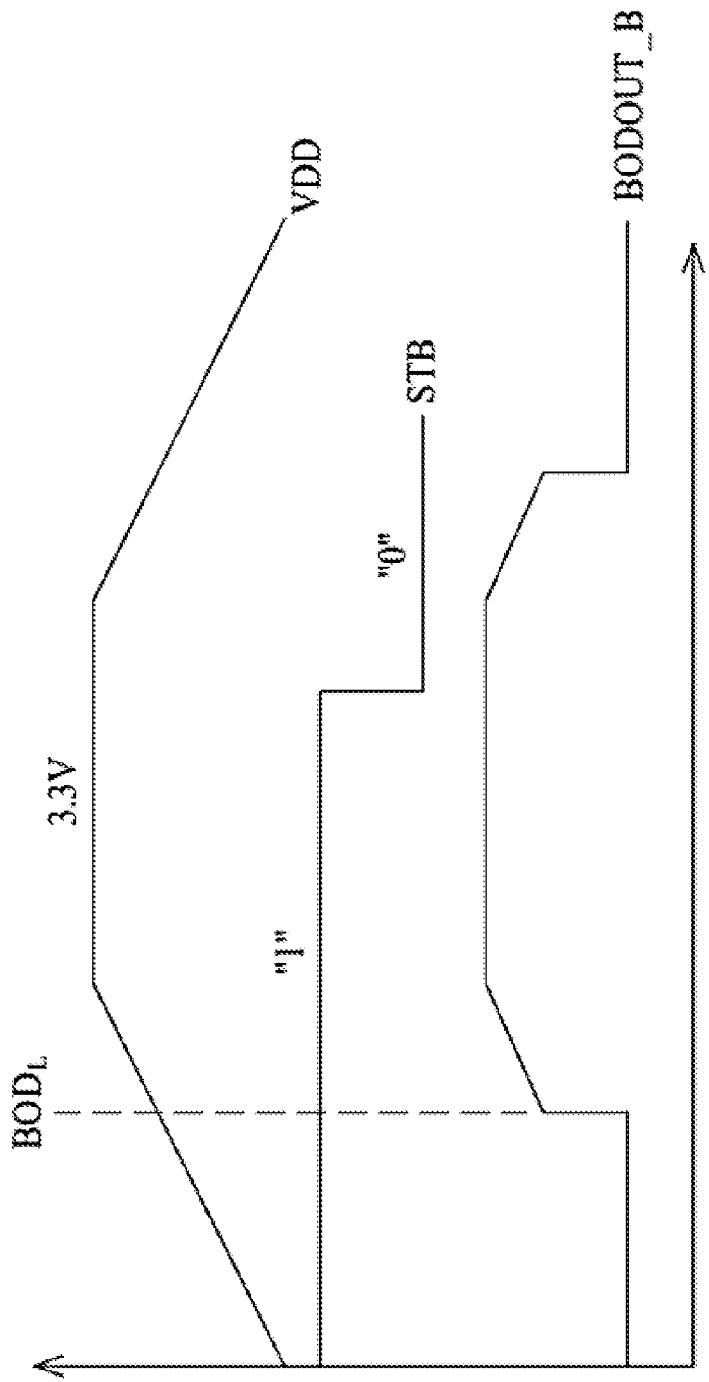
FIG. 3B is waveform diagram showing signals of the supply voltage detecting circuit in FIG. 3A.

Reference will now be made in detail to exemplary embodiments of the present disclosure, which will be illustrated in the accompanying drawings. Where possible, the same reference symbols are used in the drawings and the description to refer to the same or similar components. In addition, the implementation of the exemplary embodiment is only one of the realization ways of the design concept of the present disclosure, and the following examples are not intended to limit the present disclosure.

An embodiment of the present disclosure provides a supply voltage detecting circuit and a circuit system using the same, which have with high accuracy, low temperature drift and low power consumption. The supply voltage detecting circuit uses a base-emitter voltage difference (ΔVBE) to generate a bias voltage, so as to detect whether the supply voltage is higher than a set level $BOD_L$, and when the supply voltage is larger than the set level $BOD_L$, the whole current of the supply voltage detecting circuit will be clamped at a constant, such that the power consumption can be decreased. Moreover, after the supply voltage detecting circuit is activated, the supply voltage detecting circuit can still work without an external signal for resetting or activating.

Figure 4:
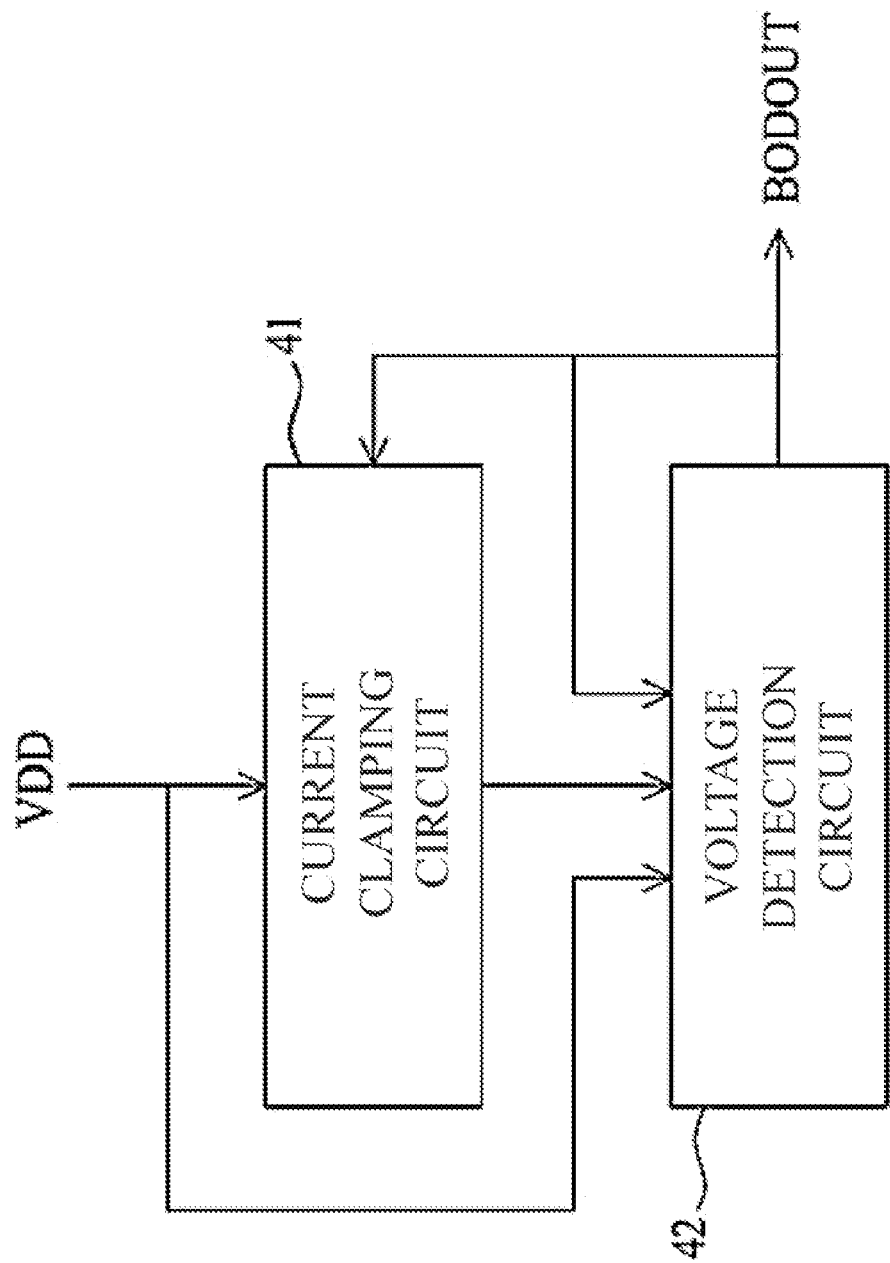
FIG. 4 is a block diagram of a supply voltage detecting circuit according to an embodiment of the present disclosure.

Firstly, refer to FIG. 4, and FIG. 4 is a block diagram of a supply voltage detecting circuit according to an embodiment of the present disclosure. The supply voltage detecting circuit 4 comprises a current clamping circuit 41 and a voltage detection circuit 42, wherein the current clamping circuit 41 and the voltage detection circuit 42 are electrically connected to each other and receive a supply voltage VDD, and the voltage detection circuit 42 outputs the low-voltage detection signal BODOUT to the current clamping circuit 41 and a load electrically connected to the supply voltage detecting circuit 4 (p.s. the load is not shown in FIG. 4, and for example, can be a circuit or chip with a specific function).

The voltage detection circuit 42 is used to detect the supply voltage VDD, and accordingly outputs the low-voltage detection signal BODOUT to control whether the current clamping circuit 41 is activated (turned on or off). When the supply voltage VDD is lower than the set level $BOD_L$ (defined as a first mode), the low-voltage detection signal BODOUT output by the voltage detection circuit 42 causes the current clamping circuit 41 to be turned off, and multiple currents flowing through the voltage detection circuit 42 (for example, in the embodiments of FIG. 5A, FIG. 6, and FIG. 7, there are two currents) will increase as the supply voltage VDD increases. However, when the supply voltage VDD is larger than or equal to the set level $BOD_L$ (defined as a first mode) the low-voltage detection signal BODOUT output by the voltage detection circuit 42 makes the current clamping circuit 41 turned on, and the current clamping circuit 41 provides a constant current (for example, the constant current IHOLD in the embodiments of FIG. 5A, FIG. 6, and FIG. 7) to maintain the voltage detection circuit 42 continues to operate, and thus, the overall power consumption of the supply voltage detecting circuit 4 is limited by the constant current provided by the current clamping circuit 41. On the other hand, the voltage detection circuit 42 uses at least two BJT transistors to generate the base-emitter voltage difference (ΔVBE) to generate the bias voltage of the voltage detection circuit 42 (for example, the voltage VBOD of FIGS. 5A, 6 and 7), so as to detect whether the supply voltage is higher than the set level $BOD_L$. Therefore, the supply voltage detecting circuit 4 is less likely to be affected by temperature drift, and can achieve high-precision detection.

Figure 5A:
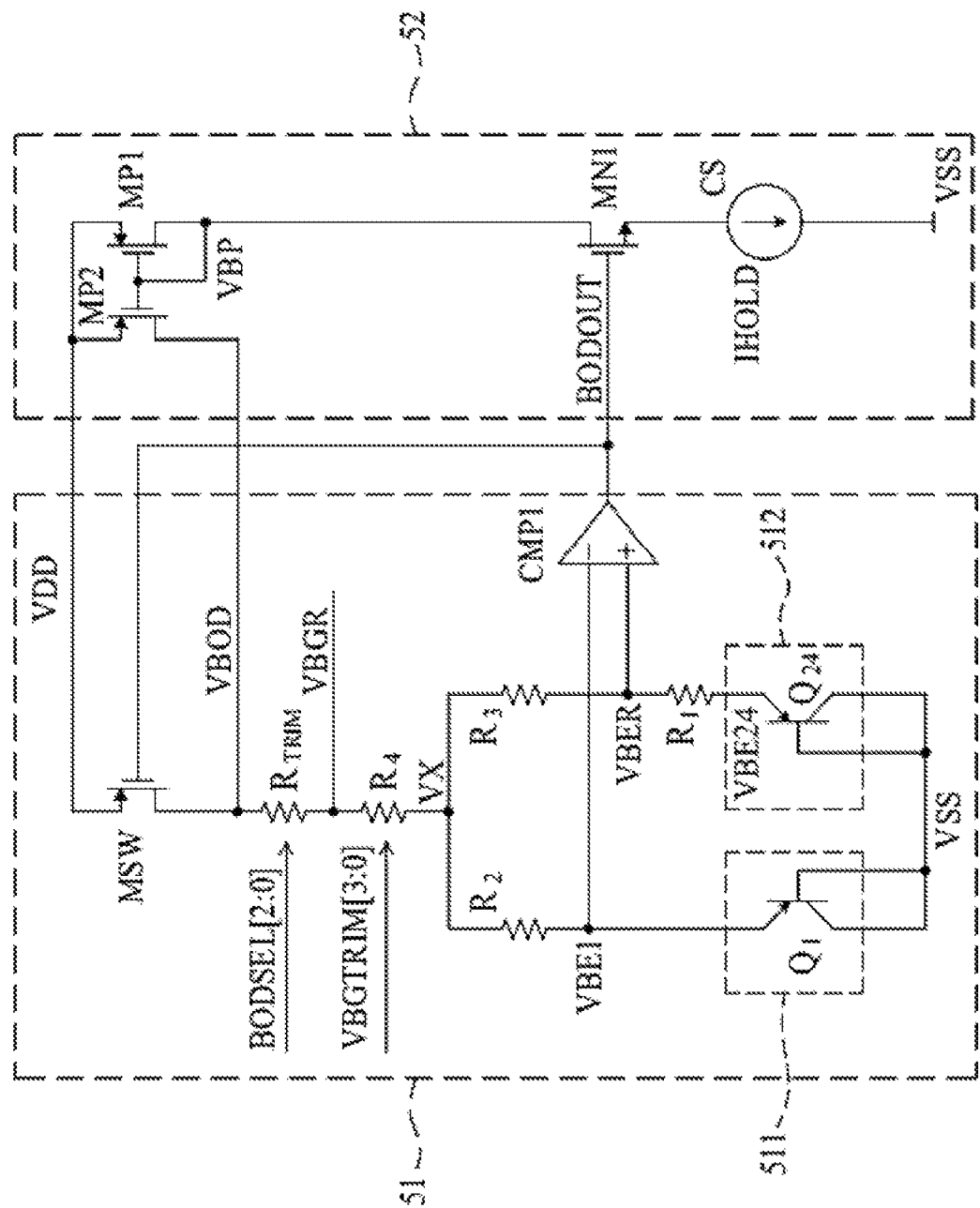
FIG. 5A is a circuit diagram of a supply voltage detecting circuit according to another one embodiment of the present disclosure.

Refer to FIG. 5A, FIG. 5A is a circuit diagram of a supply voltage detecting circuit according to another one embodiment of the present disclosure. In FIG. 5A, the current clamping circuit 52 of the supply voltage detecting circuit 5 are formed by two PMOS transistors MP1, MP2, a NMOS transistor MN1 and a current source CS, and the voltage detection circuit 51 of the supply voltage detecting circuit 5 are formed by a PMOS transistor MSW, multiple resistors $R_{TRIM}$, $R_1$ to $R_4$, a comparator CMP1 and diode circuits 511, 512 (both of them are respectively implemented by two BJT transistors $Q_1$ and $Q_{24}$, respectively).

The source of the PMOS transistor MSW receives supply voltage VDD, and the gate of the PMOS transistor MSW is electrically connected to the output terminal of the comparator CMP1 to receive the low-voltage detection signal BODOUT output from the output terminal of the comparator CMP1, and the drain of the PMOS transistor MSW is electrically connected to the drain of the PMOS transistor MP2 in the current clamping circuit 52. Thus, in the second mode, the constant current IHOLD provided by the current clamping circuit 52 is used to maintain the bias voltage level of the voltage VBOD and make the voltage detection circuit 51 receive the bias current corresponding to the constant current IHOLD (which is proportional to the constant current IHOLD, and the current value is a constant). The two terminals of the resistor RTRIM are respectively electrically connected to the drain of the PMOS transistor MSW and one terminal of the resistor $R_4$, and other one terminal of the resistor $R_4$ is electrically connected to one terminal of the resistor $R_2$ and one terminal of the resistor $R_3$. Other one terminal of the resistor $R_2$ is electrically connected the emitter of the BJT transistor $Q_1$ and the negative input terminal of the comparator CMP1, and other one terminal of the resistor $R_3$ is electrically connected to one terminal of the resistor $R_1$ and the positive input terminal of the comparator CMP1. Other one terminal of the resistor $R_1$ is electrically connected the emitter of the BJT transistor $Q_{24}$. The bases and the collectors of the BJT transistors $Q_1$, $Q_{24}$ are electrically connected the low voltage VSS, such as a ground voltage. Please note here that the resistors $R_{TRIM}$ and $R_4$ are non-essential components and can be removed in other embodiments.

The sources of the PMOS transistors MP1 and MP2 receive the supply voltage VDD, the gates of the PMOS transistors MP1 and MP2 are electrically connected to each other, and the gate of the PMOS transistor MP2 is electrically connected to the drain of the PMOS transistor MP2. The drain of the NMOS transistor MN1 is electrically connected to the drain of the PMOS transistor MP2, and the gate of the NMOS transistor MN1 is electrically connected to the output terminal of the comparator CMP1 to receive the low-voltage detection signal BODOUT output from the output terminal of the comparator CMP1, and the source of the NMOS transistor MN1 is connected to one terminal of the current source CS. The other one terminal of the current source CS is electrically connected to the low voltage VSS.

After the supply voltage detecting circuit 5 is connected to the supply voltage VDD, one of the currents of the supply voltage detecting circuit 5 will flow through the resistor $R_2$ and the BJT transistor $Q_1$ (the connection configuration makes it be used as a diode), and thereby a reference voltage VBE1 is generated, wherein the reference voltage VBE1 is the base-emitter voltage of the BJT transistor $Q_1$, and the reference voltage VBE1 is received by the negative input terminal of the comparator CMP1. Another one current of supply voltage detecting circuit 5 will flow through resistor $R_1$, $R_3$ and transistor $Q_{24}$, and a sensing voltage VBER is generated to the positive input terminal of comparator CMP1, wherein the sensing voltage VBER is the base-emitter voltage VBE24 of transistor $Q_{24}$ plus the cross voltage of resistor $R_1$. The resistor $R_{TRIM}$ and resistor $R_4$ can be variable resistors, and their resistance values are respectively changeable in response to control signals BODSEL [2:0] and VBGTRIM[3:0], so that the voltage VBGR level can be adjusted. In this way, the resistor $R_{TRIM}$ and the resistor $R_4$ can make the circuit layout easier to match and reduce process variation. However, as mentioned above, the resistors $R_{TRIM}$ and $R_4$ are unnecessary components, which can be removed, or a low dropout regulator (LDO) buffer can be used to replace them (i.e., remove the resistors $R_{TRIM}$ and $R_4$, and use the LDO buffer to provide the voltage VBGR).

When the supply voltage VDD is lower than the set level $BOD_L$ (i.e. operating in the first mode), due to the dimension of the BJT transistor $Q_1$ is designed to be smaller, the inner resistance of the BJT transistor $Q_1$ is larger, so that the reference voltage $V_{BE1}$ can be higher than the sensing voltage VBER. The low-voltage detection signal BODOUT output by the comparator CMP1 is logic low ("0"), so the PMOS transistor MSW is turned on (conductive), and the voltage VBOD on the drain of the PMOS transistor MSW is substantially equal to the supply voltage, which can reduce detection errors. At this time, the two PMOS transistors MP1, MP2 and NMOS transistor MN1 of the current clamping circuit 52 are turned off, and the voltage VBP on the drains of the PMOS transistors MP1 and MP2 is a high voltage, so the current consumed by the current clamping circuit 52 is essentially 0 (the currents of PMOS transistor MP1 and MP2 are 0) without power consumption. In addition, the two currents I_Q1 and I_Q24 flowing through the BJT transistors $Q_1$ and $Q_{24}$ are proportional to the supply voltage VDD.

When the supply voltage VDD gradually increases and is higher than or equal to the set level $BOD_L$ (i.e. operating in the second mode), the voltage VX at one terminal of the resistor $R_2$ and $R_3$ gradually increases, so that the sensing voltage VBER is higher than or equal to the reference voltage VBE1, and the low-voltage detection signal BODOUT output by the comparator CMP1 is the logic high level ("1"). At this time, the PMOS transistor MSW is turned off (non-conductive), the NMOS transistor MN1 is turned on (conductive), the PMOS transistors MP1 and MP2 are turned on (conductive) to provide constant current IHOLD to the drain of the PMOS transistor MP2 to generate voltage VBOD for biasing, and the operation of the voltage detection circuit 51 is maintained. Even if the supply voltage VDD continues to increase, the voltage detection circuit 51 is clamped by the current clamping circuit 52 and still maintains the same operating current, so power consumption can be reduced. At this time, the current I_MP2 of the PMOS transistor MP2 is set to be higher than the sum of the two currents flowing through the BJT transistors $Q_1$ and $Q_{24}$ plus 50 nA. As mentioned above, the two currents flowing through the BJT transistors $Q_1$ and $Q_{24}$ are substantially proportional to the constant current IHOLD.

In this embodiment, the convergence point is set when the current IQ1 is equal to the current IQ24, and the set level $BOD_L$ can be calculated from the currents IQ1 and IQ24 at the convergence point. At this time, IQ1=$\Delta$VBE/$R_1$=VTln (n)/$R_1$ and voltage VBOD=2*IQ1*[($R_2$//$R_3$)+$R_4$+$R_{TRIM}$]+ VBE, wherein $\Delta$VBE is the base-emitter voltage difference. Since the current IQ1 has a temperature coefficient proportional to the absolute temperature, it will affect the voltage VBOD. Therefore, resistors $R_2$, $R_3$, $R_4$, and $R_{TRIM}$ with negative temperature coefficients can be selected to make the supply voltage detecting circuit 5 less susceptible to temperature drift. In one embodiment, the reference voltage VBE1 can be set to 1.25, 2.5 or 3.75 volts.

Figure 5B:
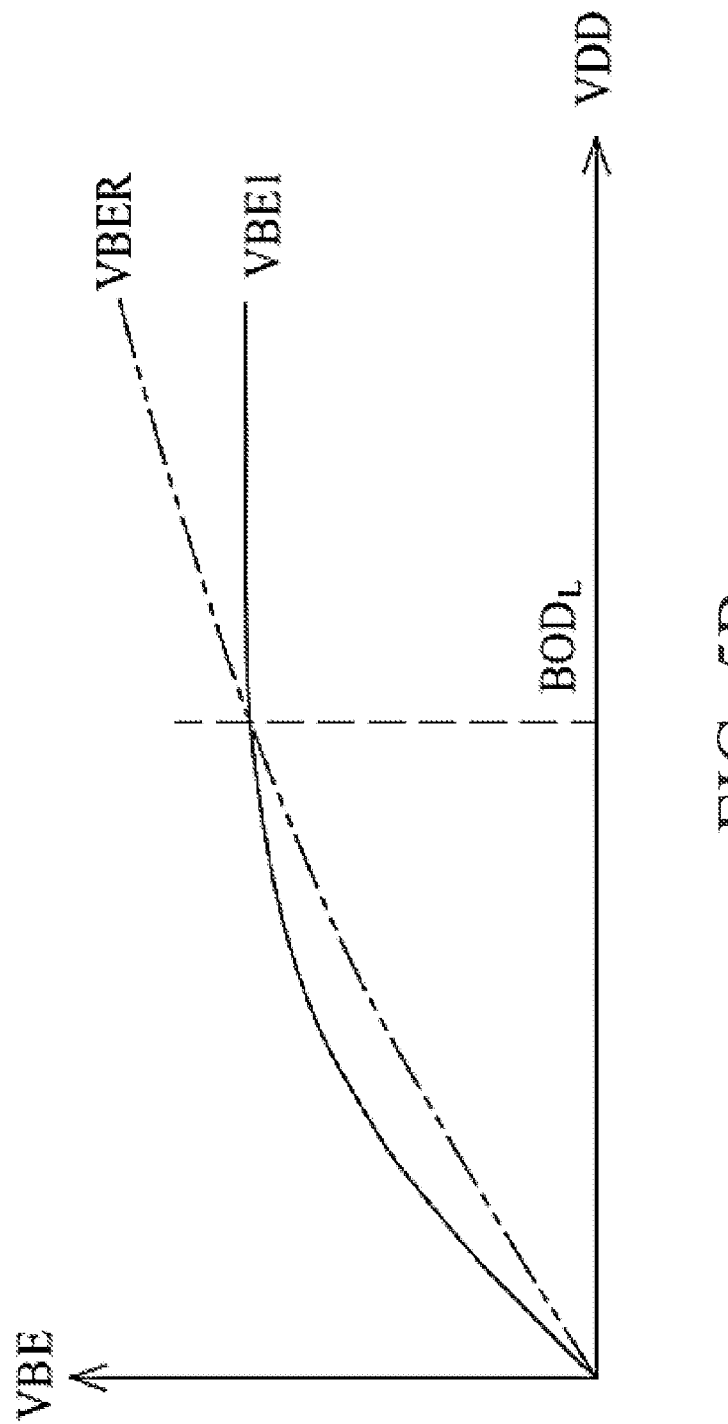
FIG. 5B is a curve diagram showing relationship between the supply voltage, the reference voltage and the sensing voltage of the supply voltage detecting circuit in FIG. 5A.

FIG. 5B is a curve diagram showing relationship between the supply voltage, the reference voltage and the sensing voltage of the supply voltage detecting circuit in FIG. 5A. As mentioned above, the relationship between the reference voltage VBE1 and the sensing voltage VBER of the two input voltages (referred to as voltage VBE) of the comparator CMP1 with respect to the supply voltage VDD is shown in FIG. 5B. When the supply voltage VDD is higher than or equal to set level $BOD_L$, the sensing voltage VBER is higher than or equal to reference voltage VBE1, and a constant voltage value is maintained at reference voltage VBE1 (clamped by current clamping circuit 52); when the supply voltage VDD is less than set level $BOD_L$, the sensing voltage VBER is less than reference voltage VBE1.

Figure 5C:
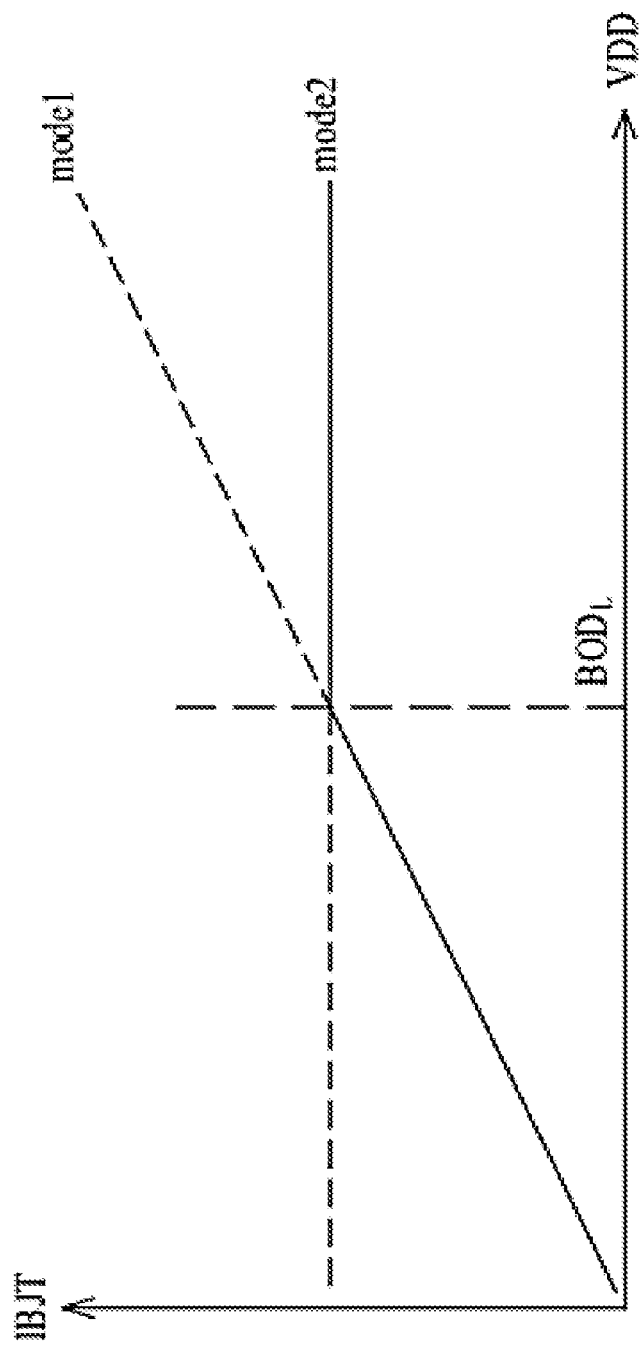
FIG. 5C is a curve diagram showing relationship between the transistor current and the transistor current when the supply voltage detecting circuit of FIG. 5A operates in the first mode or the second mode.

FIG. 5C is a curve diagram showing relationship between the transistor current and the transistor current when the supply voltage detecting circuit of FIG. 5A operates in the first mode or the second mode. As mentioned above, the sum of the two currents flowing through the BJT transistors $Q_1$ and $Q_{24}$ is represented by the transistor current IBJT. The transistor current IBJT is in the first mode mode1 (i.e. the supply voltage VDD is less than set level $BOD_L$) is proportional to the supply voltage VDD; and, the transistor current IBJT is in the second mode mode2 (i.e. the supply voltage VDD is higher than or equal to set level $BOD_L$) is a constant current and proportional to the constant current IHOLD.

Figure 6:
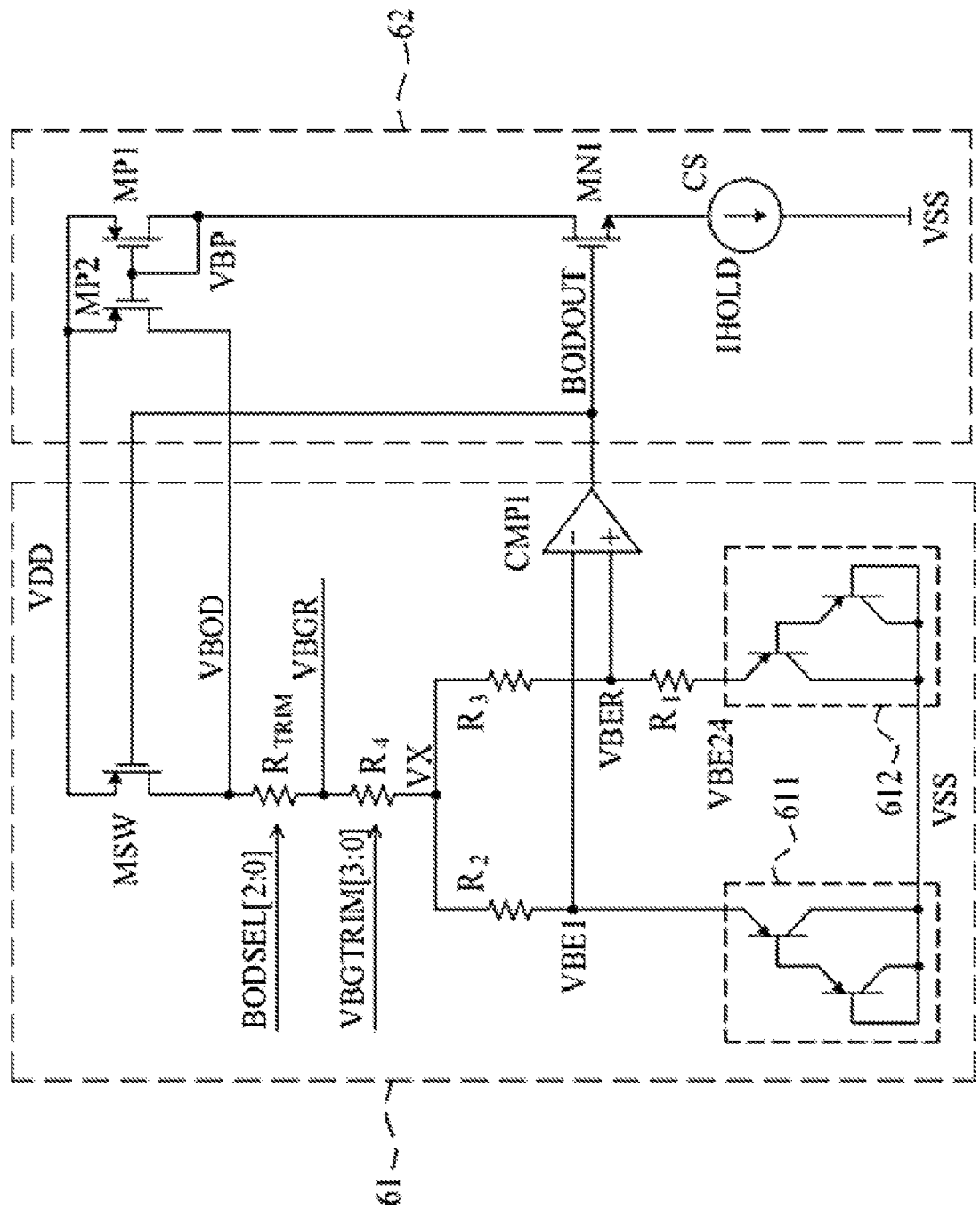
FIG. 6 is a circuit diagram of a supply voltage detecting circuit according to another one embodiment of the present disclosure.

Refer to FIG. 6, and FIG. 6 is a circuit diagram of a supply voltage detecting circuit according to another one embodiment of the present disclosure. The supply voltage detecting circuit 6 comprises a current clamping circuit 62 and a voltage detection circuit 61. The current clamping circuit 62 is the same as the current clamping circuit 52 in FIG. 5. The diode circuits 611 and 612 of the voltage detection circuit 61 are slightly different from the diode circuits 511 and 512 of the voltage detection circuit 51 in FIG. 5. Each of the diode circuits 611 and 612 is implemented by two BJT transistors with a diode connecting configuration to provide twice the bias voltage of the diode circuits 511 and 512. For example, the voltages VBE1 and VBE24 in FIG. 5 are 1.25 volts, and the voltages VBE1 and VBE24 in FIG. 6 are 2.5 volts.

Figure 7:
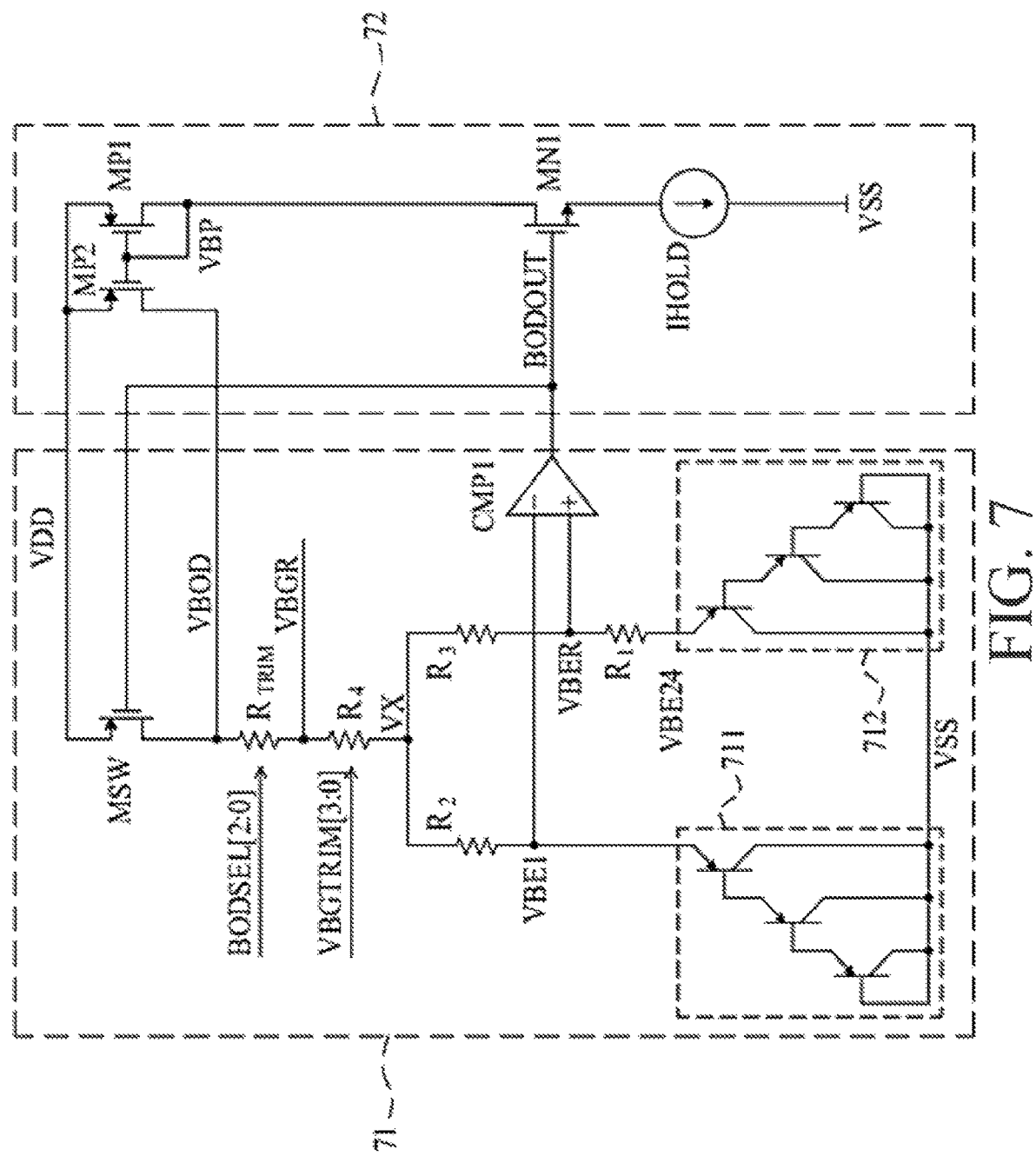
FIG. 7 is a circuit diagram of a supply voltage detecting circuit according to another one embodiment of the present disclosure.

Refer to FIG. 7, and FIG. 7 is a circuit diagram of a supply voltage detecting circuit according to another one embodiment of the present disclosure. The supply voltage detecting circuit 7 comprises a current clamping circuit 72 and a voltage detection circuit 71, the current clamping circuit 72 is the same as current clamping circuit 52 in FIG. 5, and the diode circuits 711 and 712 of the voltage detection circuit 71 are slightly different from the diode circuits 511 and 512 of the voltage detection circuit 51 in FIG. 5. Each of the diode circuits 711 and 712 is implemented by three BJT transistors with a diode connecting configuration to provide three times the bias voltage of the diode circuits 511 and 512. For example, as shown in FIG. 5, the voltages VBE1 and VBE24 are 1.25 volts, and the voltages VBE1 and VBE24 in FIG. 7 are 3.75 volts.

Figure 8:
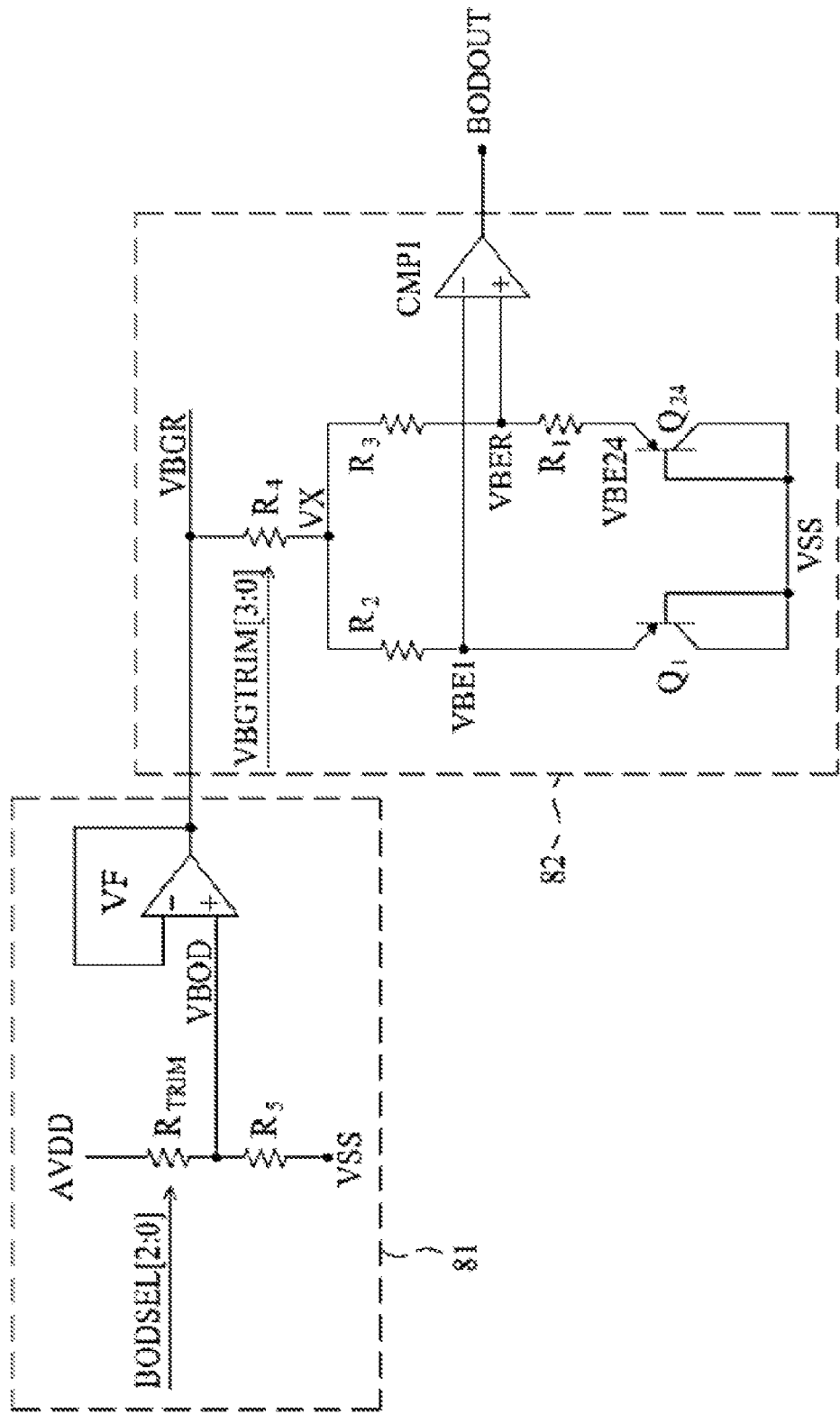
FIG. 8 is a circuit diagram of a supply voltage detecting circuit according to another one embodiment of the present disclosure.

Refer to FIG. 8, and FIG. 8 is a circuit diagram of a supply voltage detecting circuit according to another one embodiment of the present disclosure. The supply voltage detecting circuit 8 does not have a current clamping circuit, but comprises an adjustable voltage generator 81 and a voltage detection circuit 82. The voltage detection circuit 82 is roughly similar to the voltage detection circuit 51 in FIG. 5, and the resistor in the voltage detection circuit 51 in FIG. 5 are replaced by the resistor $R_{TRIM}$ and the PMOS transistor MSW of the adjustable voltage generator 81, so to form the supply voltage detecting circuit 8.

The adjustable voltage generator 81 comprises the resistors $R_{TRIM}$, $R_5$ and the voltage follower VF. The two terminals of the resistor $R_{TRIM}$ are respectively electrically connected to the supply voltage AVDD and one terminal of the resistor $R_5$, and the other terminal of the resistor $R_5$ is electrically connected to the low voltage VSS. The voltage follower VF is implemented by, for example, a comparator, but the present disclosure is not limited thereto. The output terminal of the voltage follower VF is electrically connected to the negative input terminal of the voltage follower VF, and the positive input terminal of the voltage follower VF is electrically connected to one terminal of the resistor $R_5$ and the other terminal of the resistor $R_{TRIM}$ (i.e. the junction of resistors $R_5$ and $R_{TRIM}$) to receive the voltage VBOD which is used to bias the voltage detection circuit 82. The connection mode of the voltage follower VF makes it used as a buffer, so the voltage VBGR is substantially equal to the voltage VBOD, and the level of the voltage VBOD can be achieved by adjusting the resistance value of the resistor $R_{TRIM}$ via the control signal BODSEL[2:0]. The operating principle of the supply voltage detecting circuit 8 is similar to that of supply voltage detecting circuits 4-7. When the supply voltage AVDD is lower than set level $BOD_L$ (i.e. operating in the first mode), the low-voltage detection signal BODOUT output by supply voltage detecting circuit 8 is logic low level ("0"). When the supply voltage AVDD is higher than or equal to the set level $BOD_L$ (i.e. operating in the second mode), the low-voltage detection signal BODOUT output by the supply voltage detecting circuit 8 is the logic high level ("1"). In this embodiment, regardless of operating in the first or second mode, the two currents I_Q1 and I_Q24 flowing through the BJT transistors $Q_1$ and $Q_{24}$ are proportional to the supply voltage AVDD.

In addition, embodiments of the present invention also provide a circuit system, which comprises a load and any of the above-mentioned supply voltage detecting circuits 4-8, wherein the load can be electrically connected to the supply voltage detecting circuit, and the load can be any functional chip or functional circuit that needs to use the supply voltage detection result.

In summary, compared with the prior art, the embodiments of the present disclosure provide a supply voltage detecting circuit and a circuit system using the same, wherein the supply voltage detecting circuit has high accuracy, low temperature drift and low power consumption. Furthermore, when the supply voltage is higher than the set level, the voltage detection circuit in the supply voltage detecting circuit is clamped to a constant current, so power consumption can be effectively reduced; and because the base-emitter voltage difference (ΔVBE) is used to generate a bias voltage to detect whether the supply voltage is higher than the set level $BOD_L$. Therefore, the temperature drift is less affected, and the accuracy can be improved. Furthermore, the supply voltage detecting circuit can continue to be used after it is activated, without the need to reset or activate it through an external signal.

Although the present invention is disclosed in the foregoing embodiments as above, it is not intended to limit the present invention. Anyone familiar with similar art can make some changes and modifications without departing from the spirit and scope of the present invention. Therefore, the scope of patent protection of the present invention shall be determined by the scope of the patent application attached to this specification.

The invention claimed is:

1. A supply voltage detecting circuit, comprising:
a voltage detection circuit, for receiving a supply voltage and detecting the supply voltage to generate a low-voltage detection signal; and
a current clamping circuit, electrically connected to the voltage detection circuit;
wherein when the supply voltage is lower than a set level, the low-voltage detection signal output by the voltage detection circuit turns off the current clamping circuit, and a transistor current flowing through the voltage detection circuit is proportional to the supply voltage;
wherein when the supply voltage is higher than or equal to the set level, the low-voltage detection signal output by the voltage detection circuit turns on the current clamping circuit, and the current clamping circuit provides a constant current to maintain operation of the voltage detection circuit, and the transistor current flowing through the voltage detection circuit is proportional to the constant current.

2. The supply voltage detecting circuit according to claim 1, wherein the voltage detection circuit comprises a switch PMOS transistor, a first resistor, a second resistor, a third resistor, a comparator, a first diode circuit and a second diode circuit, wherein a source of the switch PMOS transistor receives the supply voltage, a gate of the switch PMOS transistor is electrically connected to an output terminal of the comparator, a drain of the switch PMOS transistor is electrically connected to a first terminal of the second resistor and a first terminal of the third resistor, a second terminal of the second resistor and a second terminal of the third resistor are respectively electrically connected to a negative input terminal and a positive input terminal of the comparator, an output terminal of the comparator outputs the low-voltage detection signal and is electrically connected to the current clamping circuit to control an on/off state of the current clamping circuit, the first diode circuit is electrically connected to the second terminal of the second resistor, a first terminal of the first resistor is electrically connected to the second terminal of the third resistor, a second terminal of the first resistor is electrically connected to the second diode circuit, and the drain of the switch PMOS transistor is further electrically connected to one terminal of the current clamping circuit, so as to receive the transistor current proportional to the constant current when the current clamping circuit is turned on.

3. The supply voltage detecting circuit according to claim 1, wherein the current clamping circuit comprises a first PMOS transistor, a second PMOS transistor, a first NMOS transistor and a current source, a source of the first transistor and a source of the second PMOS transistors receive the supply voltage, a gate of the first PMOS transistor is electrically connected to a gate and a drain of the second PMOS transistor, and a drain of the first PMOS transistor is electrically connected to the voltage detection circuit, so as to provide the transistor current proportional to the constant current when the current clamping circuit is turned on, wherein a gate of the first NMOS transistor is electrically connected to the voltage detection circuit to receive the low-voltage detection signal, a drain of the first NMOS transistor is electrically connected to the drain of the first PMOS transistor and the drain of the second PMOS transistor, and a source of the first NMOS transistor is electrically connected to the current source to receive the constant current provided by the current source.

4. The supply voltage detecting circuit according to claim 2, wherein each of the first diode circuit and the second diode circuit comprises at least one BJT transistor.

5. The supply voltage detecting circuit according to claim 2, wherein the voltage detection circuit further comprises a fourth resistor and a trimming resistor, a first terminal of the trimming resistor is electrically connected to the drain of the switch PMOS transistor, a second terminal of the trimming resistor is electrically connected to the fourth resistor, and the second terminal of the fourth resistor is electrically connected to the first terminal of the second resistor and the first terminal of the third resistor.

6. The supply voltage detecting circuit according to claim 5, wherein the fourth resistor and the trimming resistor are variable resistors, and a resistance value of the fourth resistor and a resistance value of the trimming resistor are respectively changed in response to two control signals.

7. A circuit system, comprising:
a load; and
a supply voltage detecting circuit, electrically connected to the load, and comprising:
  a voltage detection circuit, for receiving a supply voltage and detecting the supply voltage to generate a low-voltage detection signal; and
  a current clamping circuit, electrically connected to the voltage detection circuit;
  wherein when the supply voltage is lower than a set level, the low-voltage detection signal output by the voltage detection circuit turns off the current clamping circuit, and a transistor current flowing through the voltage detection circuit is proportional to the supply voltage; when the supply voltage is higher than or equal to the set level, the low-voltage detection signal output by the voltage detection circuit turns on the current clamping circuit, and the current clamping circuit provides a constant current to maintain operation of the voltage detection circuit, and the transistor current flowing through the voltage detection circuit is proportional to the constant current.

8. The circuit system according to claim 7, wherein the voltage detection circuit comprises a switch PMOS transistor, a first resistor, a second resistor, a third resistor, a comparator, a first diode circuit and a second diode circuit, wherein a source of the switch PMOS transistor receives the supply voltage, a gate of the switch PMOS transistor is electrically connected to an output terminal of the comparator, a drain of the switch PMOS transistor is electrically connected to a first terminal of the second resistor and a first terminal of the third resistors, a second terminal of the second resistor and a second terminal of the third resistors are respectively electrically connected to a negative input terminal and a positive input terminal of the comparator, an output terminal of the comparator outputs the low-voltage detection signal and is electrically connected to the current clamping circuit to control an on/off state of the current clamping circuit, the first diode circuit is electrically connected to the second terminal of the second resistor, a first terminal of the first resistor is electrically connected to the second terminal of the third resistor, a second terminal of the first resistor is electrically connected to the second diode circuit, and the drain of the switch PMOS transistor is further electrically connected to one terminal of the current clamping circuit, so as to receive a current proportional to the constant current when the current clamping circuit is turned on.

9. The circuit system according to claim 7, wherein the current clamping circuit comprises a first PMOS transistor, a second PMOS transistor, a first NMOS transistor and a current source, a source of the first transistor and a source of the second PMOS transistors receive the supply voltage, a gate of the first PMOS transistor is electrically connected to a gate and a drain of the second PMOS transistor, and a drain of the first PMOS transistor is electrically connected to the voltage detection circuit, so as to provide the transistor current proportional to the constant current when the current clamping circuit is turned on, wherein a gate of the first NMOS transistor is electrically connected to the voltage detection circuit to receive the low-voltage detection signal, a drain of the first NMOS transistor is electrically connected to the drain of the first PMOS transistor and the drain of the second PMOS transistor, and a source of the first NMOS transistor is electrically connected to the current source to receive the constant current provided by the current source.

10. The circuit system according to claim 8, wherein each of the first diode circuit and the second diode circuit comprises at least one BJT transistor.

11. The circuit system according to claim 8, wherein the voltage detection circuit further comprises a fourth resistor and a trimming resistor, a first terminal of the trimming resistor is electrically connected to the drain of the switch PMOS transistor, a second terminal of the trimming resistor is electrically connected to the fourth resistor, and the second terminal of the fourth resistor is electrically connected to the first terminal of the second resistor and the first terminal of the third resistor.

12. The circuit system according to claim 11, wherein the fourth resistor and the trimming resistor are variable resistors, and a resistance value of the fourth resistor and a resistance value of the trimming resistor are respectively changed in response to two control signals.

* * * * *